(12) United States Patent
Kim et al.

(10) Patent No.: US 10,483,040 B1
(45) Date of Patent: Nov. 19, 2019

(54) ELECTRONIC COMPONENT

(71) Applicant: SAMSUNG ELECTRO-MECHANICS CO., LTD., Suwon-si, Gyeonggi-do (KR)

(72) Inventors: Ho Yoon Kim, Suwon-si (KR); Sang Soo Park, Suwon-si (KR); Woo Chul Shin, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/198,038

(22) Filed: Nov. 21, 2018

(30) Foreign Application Priority Data

Sep. 14, 2018 (KR) .......................... 10-2018-0110352

(51) Int. Cl.
*H01G 4/30* (2006.01)
*H01G 4/40* (2006.01)
*H01G 4/232* (2006.01)

(52) U.S. Cl.
CPC .............. *H01G 4/232* (2013.01); *H01G 4/40* (2013.01); *H01G 4/30* (2013.01)

(58) Field of Classification Search
CPC ............. H01G 4/232; H01G 4/40; H01G 4/30
USPC ...................................................... 361/301.4
See application file for complete search history.

(56) References Cited

U.S. PATENT DOCUMENTS

| 2013/0033836 | A1 | 2/2013 | Hattori et al. |
| 2015/0206661 | A1 | 7/2015 | Fujimura et al. |
| 2015/0270068 | A1* | 9/2015 | Hattori ............... H01G 4/30 361/301.4 |
| 2016/0088735 | A1 | 3/2016 | Park et al. |

FOREIGN PATENT DOCUMENTS

| JP | 6248644 B2 | 12/2017 |
| KR | 10-1476391 B1 | 9/2014 |

OTHER PUBLICATIONS

U.S. Non-Final Office Action dated Sep. 11, 2019 issued in U.S. Appl. No. 16/507,978.

* cited by examiner

*Primary Examiner* — Michael P McFadden
(74) *Attorney, Agent, or Firm* — Morgan, Lewis & Bockius LLP

(57) ABSTRACT

An electronic component includes: a multilayer ceramic capacitor including a capacitor body and a pair of external electrodes, and an interposer including an interposer body having grooves and a pair of external terminals. Each of the external terminals includes a bonding portion, a mounting portion and a connection portion; and $\Delta L = |A - A'|/2$ in which A is a distance from one end portion of the interposer in a length direction to one end portion of the multilayer ceramic capacitor in the length direction, A' is a distance from the other end portion of the interposer in the length direction to the other end portion of the multilayer ceramic capacitor in the length direction, and $\Delta L$ is an offset between the multilayer ceramic capacitor and the interposer in the length direction, and $\Delta L/L \leq 0.100$ in which L is a length of the multilayer ceramic capacitor.

20 Claims, 6 Drawing Sheets

ELECTRONIC COMPONENT

CROSS-REFERENCE TO RELATED APPLICATION(S)

This application claims benefit of priority to Korean Patent Application No. 10-2018-0110352 filed on Sep. 14, 2018 in the Korean Intellectual Property Office, the disclosure of which is incorporated herein by reference in its entirety.

TECHNICAL FIELD

The present disclosure relates to an electronic component.

BACKGROUND

A multilayer ceramic capacitor (MLCC) may be used as a component of various electronic devices, since it is relatively small, implements high capacitance, and may be easily mounted.

The multilayer ceramic capacitor has a structure in which internal electrodes having different polarities are alternately stacked between a plurality of dielectric layers.

A material of the dielectric layer may be a ferroelectric material. Since the ferroelectric material has piezoelectric characteristics, when a direct current (DC) or alternating current (AC) voltage is applied to the multilayer ceramic capacitor, a piezoelectric phenomenon may occur between the internal electrodes to generate periodic vibrations, while expanding and contracting a capacitor body depending on a frequency.

These vibrations may be transferred to a board through external electrodes of the multilayer ceramic capacitor and solders connecting the external electrodes and the board to each other, such that the entirety of the board becomes a sound reflecting surface to generate vibration sound, known as noise.

The vibration sound may correspond to an audio frequency causing listener discomfort. The vibration sound causing listener discomfort as described above is known as acoustic noise.

In a method of reducing these vibrations, there is an electronic component in which an interposer is disposed between the multilayer ceramic capacitor and the board.

However, in accordance with the trend toward performance improvements and miniaturization of the electronic device, the necessity for an electronic component having a small size has increased. Therefore, demand for technology capable of effectively reducing vibration sound in a multilayer ceramic capacitor having a small size of 0804 or less has increased.

SUMMARY

An aspect of the present disclosure may provide an electronic component in which an acoustic noise reducing effect, of a predetermined level or more, may be expected, even in a multilayer ceramic capacitor having a small size.

According to an aspect of the present disclosure, an electronic component may include: a multilayer ceramic capacitor including a capacitor body and a pair of external electrodes disposed on opposite ends of the capacitor body, respectively; and an interposer including an interposer body having grooves in opposite surfaces thereof, respectively, and a pair of external terminals disposed at opposite ends of the interposer body, respectively. Each of the external terminals may include a bonding portion disposed on an upper surface of the interposer body and connected to a respective one of the the external electrodes, a mounting portion disposed on a lower surface of the interposer body, and a connection portion disposed on a respective one of the grooves of the interposer body to connect the bonding portion and the mounting portion to each other. $\Delta L/L \leq 0.100$ in which L is a length of the multilayer ceramic capacitor and $\Delta L = |A-A'|/2$, where A is a distance from one end portion of the interposer in a length direction to one end portion of the multilayer ceramic capacitor in the length direction, and A' is a distance from the other end portion of the interposer in the length direction to the other end portion of the multilayer ceramic capacitor in the length direction.

According to another aspect of the present disclosure, an electronic component may include: a multilayer ceramic capacitor including a capacitor body and a pair of external electrodes disposed on opposite ends of the capacitor body, respectively; and an interposer including an interposer body having grooves in opposite surfaces thereof, respectively, and a pair of external terminals disposed at opposite ends of the interposer body, respectively. Each of the external terminals may include a bonding portion disposed on an upper surface of the interposer body and connected to a respective one of the external electrodes, a mounting portion disposed on a lower surface of the interposer body, and a connection portion disposed on a respective one of the grooves of the interposer body to connect the bonding portion and the mounting portion to each other. $\Delta W/W \leq 0.167$ in which W is a width of the multilayer ceramic capacitor and $\Delta W = |B-B'|/2$, where B is a distance from one end portion of the interposer in a width direction to one end portion of the multilayer ceramic capacitor in the width direction, and B' is a distance from the other end portion of the interposer in the width direction to the other end portion of the multilayer ceramic capacitor in the width direction.

According to another aspect of the present disclosure, an electronic component may include: a multilayer ceramic capacitor including a capacitor body, and first and second external electrodes respectively disposed on end surfaces of the capacitor body opposing each other in a length direction of the capacitor body and respectively having first and second band portions extending onto one of side surfaces of the capacitor body connecting the end surfaces of the capacitor body to each other; and an interposer including an interposer body having grooves in surfaces opposing each other in the length direction, and first and second external terminals respectively disposed at ends of the interposer body opposing each other in the length direction. The first external terminal may include a first bonding portion disposed on a portion of an upper surface of the interposer body and connected to the first band portion of the first external electrode, a first mounting portion disposed on a portion of a lower surface of the interposer body, and a first connection portion disposed on one of the grooves of the interposer body to connect the first bonding portion and the first mounting portion to each other. The second external terminal may include a second bonding portion disposed on another portion of the upper surface of the interposer body and connected to the second band portion of the second external electrode, a second mounting portion disposed on another portion of the lower surface of the interposer body, and a second connection portion disposed on the other of the grooves of the interposer body to connect the second bonding portion and the second mounting portion to each other. $Lc \leq Li$, in which Lc is a distance in the length direction between centers of the first and second band portions of the first and second external electrodes, and Li is a shortest distance in the length direction between the connection portions disposed on the grooves in the opposite surfaces of the interposer body.

The multilayer ceramic capacitor may have a length of 0.8 mm or less and a width of 0.4 mm or less.

The multilayer ceramic capacitor may have a thickness of 0.7 mm or less.

Conductive adhesive portions may be formed between the external electrode and the external terminal, respectively.

The interposer body may be formed of an insulator.

The capacitor body may have first and second surfaces opposing each other, third and fourth surfaces connected to the first and second surfaces and opposing each other, and fifth and sixth surfaces connected to the first and second surfaces, connected to the third and fourth surfaces, and opposing each other, and may include a plurality of dielectric layers and a plurality of first and second internal electrodes alternately arranged in a direction connecting the first and second surfaces to each other with each of the dielectric layers interposed therebetween, and ends of the first and second internal electrodes may be exposed through the third and fourth surfaces, respectively, to be connected to the pair of external electrodes, respectively.

The external electrodes may include: head portions disposed on the third and fourth surfaces of the capacitor body, respectively, and connected to the one ends of the first and second internal electrodes, respectively; and band portions extending from the head portions onto portions of the first surface of the capacitor body and connected to the bonding portions of the external terminals, respectively.

Lc≤Li in which Lc is a distance in the length direction between centers of the band portions of the external electrodes, and Li is a shortest distance in the length direction between the connection portions disposed on the grooves formed in the opposite surfaces of the interposer body.

The electronic component may further include plating layers disposed on surfaces of the external electrode and the external terminal, respectively.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
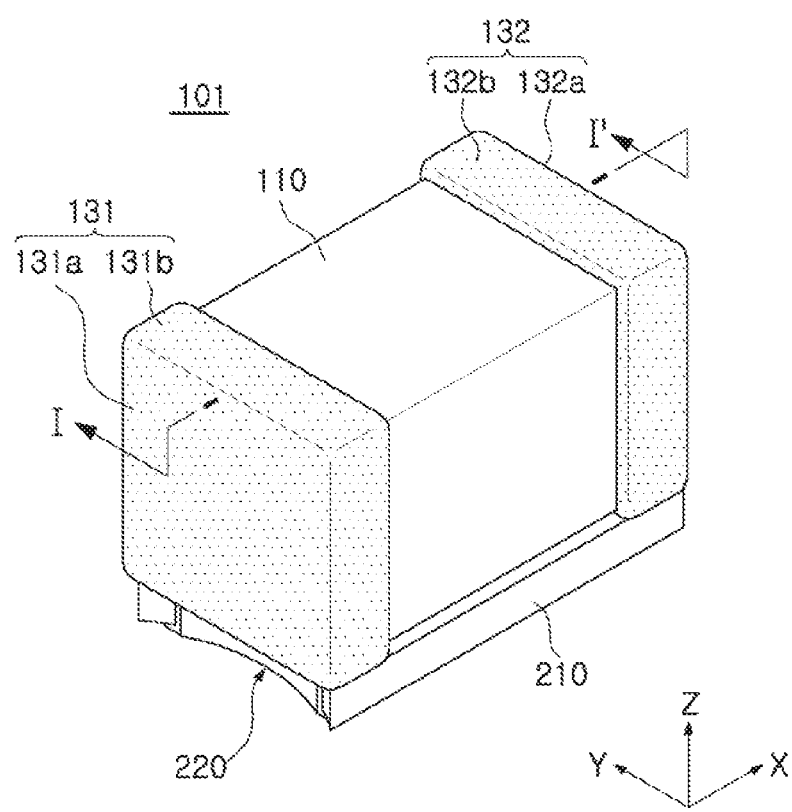
FIG. 1 is a schematic perspective view illustrating an electronic component according to an exemplary embodiment in the present disclosure.

Hereinafter, exemplary embodiments of the present disclosure will now be described in detail with reference to the accompanying drawings.

Directions will be defined in order to clearly describe exemplary embodiments in the present disclosure. X, Y and Z in the drawings refer to a length direction, a width direction, and a thickness direction of a multilayer ceramic capacitor and an interposer, respectively.

Here, the Z direction refers to a stacking direction in which dielectric layers are stacked.

Figure 2:
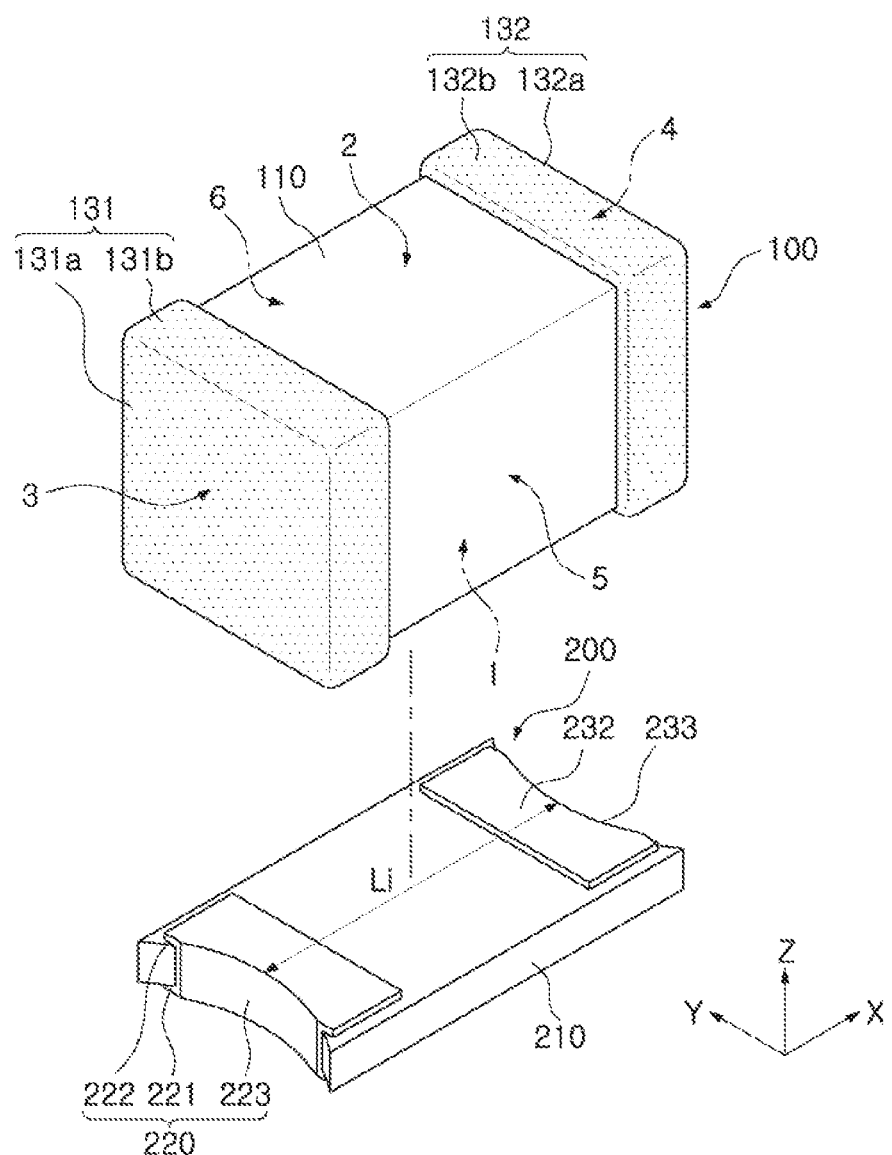
FIG. 2 is an exploded perspective view of FIG. 1.
Figure 3A:
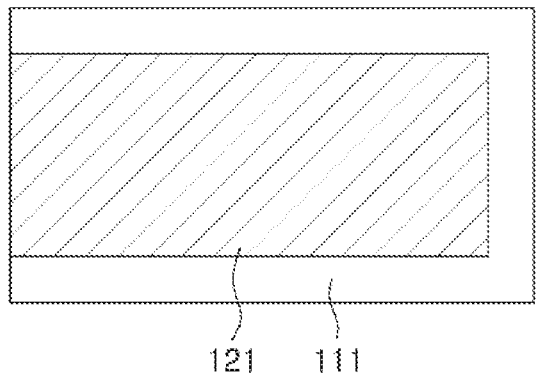
FIGS. 3A and 3B are plan views respectively illustrating first and second internal electrodes of a multilayer ceramic capacitor of FIG. 1.
Figure 3B:
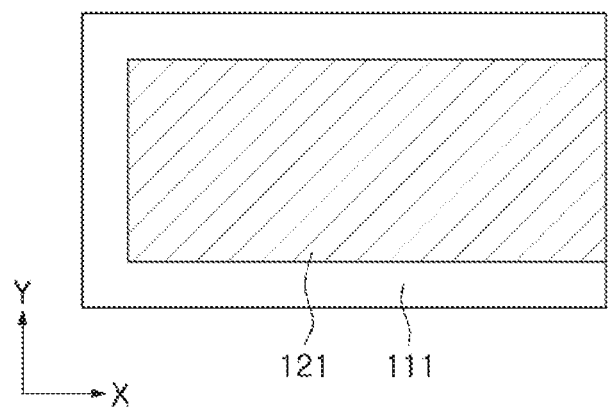

FIG. 1 is a schematic perspective view illustrating an electronic component according to an exemplary embodiment in the present disclosure, FIG. 2 is an exploded perspective view of FIG. 1, and FIGS. 3A and 3B are plan views respectively illustrating first and second internal electrodes of a multilayer ceramic capacitor of FIG. 1.

An electronic component according to the present exemplary embodiment may include a multilayer ceramic capacitor and an interposer having a length and a width smaller than those of the multilayer ceramic capacitor. The multilayer ceramic capacitor may include a capacitor body and a pair of external electrodes disposed on opposite ends of the capacitor body, respectively, and the interposer may include an interposer body having grooves in opposite surfaces thereof, respectively, and a pair of external terminals disposed at opposite ends of the interposer body, respectively.

In addition, $\Delta L=|A-A'|/2$ in which A is a distance from one end portion of the interposer in an X direction, a length direction, to one end portion of the multilayer ceramic capacitor in the X direction, A' is a distance from the other end portion of the interposer in the X direction to the other end portion of the multilayer ceramic capacitor in the X direction, and $\Delta L$ is an offset between the multilayer ceramic capacitor and the interposer in the X direction, and $\Delta L/L \leq 0.100$ in which L is a length of the multilayer ceramic capacitor. $\Delta L/L$ may be equal to 0 or greater than 0.

In addition, $\Delta W=|B-B'|/2$ in which B is a distance from one end portion of the interposer in a Y direction, a width direction, to one end portion of the multilayer ceramic capacitor in the Y direction, B' is a distance from the other end portion of the interposer in the Y direction to the other end portion of the multilayer ceramic capacitor in the Y direction, and $\Delta W$ is an offset between the multilayer ceramic capacitor and the interposer in the Y direction, and $\Delta W/W \leq 0.167$ in which W is a width of the multilayer ceramic capacitor. $\Delta W/W$ may be equal to 0 or greater than 0.

A structure of a multilayer ceramic capacitor 100 used in an electronic component 101 according to the present exemplary embodiment will be described with reference to FIGS. 1 through 3B.

The multilayer ceramic capacitor 100 according to the present exemplary embodiment may include a capacitor body 110 and first and second external electrodes 131 and 132 at opposite ends of the capacitor body 110 in the X direction, respectively.

In this case, a length of the multilayer ceramic capacitor 100 in the X direction may be 0.8 mm or less, and a width of the multilayer ceramic capacitor 100 in the Y direction may be 0.4 mm or less.

In addition, a thickness of the multilayer ceramic capacitor 100 in the Z direction may be 0.7 mm or less.

The ceramic body 110 may be formed by stacking and then sintering a plurality of dielectric layers 111 in the Z direction, and adjacent dielectric layers 111 of the capacitor body 110 may be integrated with each other so that boundaries therebetween are not readily apparent without using a scanning electron microscope (SEM).

In addition, the capacitor body 110 may include the plurality of dielectric layers 111 and first and second internal electrodes 121 and 122 alternately arranged in the Y direction with each of the dielectric layers 111 interposed therebetween and having different polarities.

In addition, the capacitor body 110 may include an active region contributing to forming capacitance in the multilayer ceramic capacitor, and upper and lower cover regions 112 and 113 (shown in FIG. 4 to be described later) provided as margin portions on upper and lower surfaces of the active region in the Z direction, respectively. The capacitor body 110 may further side margin portions at opposite side portions of the capacitor body 110 in the Y direction, respectively.

A shape of the capacitor body 110 is not particularly limited, but may be a hexahedral shape, and the capacitor body 110 may have first and second surfaces 1 and 2 opposing each other in the Z direction, third and fourth surfaces 3 and 4 connected to the first and second surfaces 1 and 2 and opposing each other in the X direction, and fifth and sixth surfaces 5 and 6 connected to the first and second surfaces 1 and 2, connected to the third and fourth surfaces 3 and 4, and opposing each other in the Y direction.

The dielectric layer 111 may include ceramic powders such as $BiTiO_3$-based ceramic powders, or the like.

An example of the $BiTiO_3$-based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which Ca, Zr, or the like, is partially solid-dissolved in $BaTiO_3$. However, the $BiTiO_3$-based ceramic powder is not limited thereto.

In addition, the dielectric layer 111 may further include a ceramic additive, an organic solvent, a plasticizer, a binder, a dispersant, and the like, in addition to the ceramic powders.

The ceramic additive may include, for example, a transition metal oxide or a transition metal carbide, a rare earth element, magnesium (Mg), aluminum (Al), or the like.

The first and second internal electrodes 121 and 122, which are electrodes having different polarities, may be formed on the dielectric layers 111 and be stacked in the Z direction, and may be alternately arranged in the capacitor body 110 to face each other in the Z direction with each of the dielectric layers 111 interposed therebetween.

In this case, the first and second internal electrodes 121 and 122 may be electrically insulated from each other by each of the dielectric layers 111 disposed therebetween.

Meanwhile, a structure in which the internal electrodes are stacked in the Z direction is illustrated and described in the present disclosure. However, the present disclosure is not limited thereto, and may also be applied to a structure in which the internal electrodes are stacked in the Y direction, if necessary.

One ends of the first and second internal electrodes 121 and 122 may be exposed through the third and fourth surfaces 3 and 4 of the capacitor body 110, respectively.

The end portions of the first and second internal electrodes 121 and 122 alternately exposed through the third and fourth surfaces 3 and 4 of the capacitor body 110, respectively, may be electrically connected to first and second external electrodes 131 and 132 to be described below disposed at opposite end portions of a capacitor body 110 in the X direction, respectively.

According to the configuration as described above, when predetermined voltages are applied to the first and second external electrodes 131 and 132, electric charges may be accumulated between the first and second internal electrodes 121 and 122.

In this case, a capacitance of the multilayer ceramic capacitor 100 may be in proportion to an area of the first and second internal electrodes 121 and 122 overlapping each other in the Z direction in the active region.

In addition, a material of each of the first and second internal electrodes 121 and 122 is not particularly limited, and may be a conductive paste, or the like, formed of one or more of, for example, a noble metal material such as a platinum (Pt), palladium (Pd), a palladium-silver (Pd—Ag) alloy, or the like, nickel (Ni), and copper (Cu).

In this case, a method of printing the conductive paste may be a screen printing method, a gravure printing method, or the like, but is not limited thereto.

Voltages having different polarities may be provided to the first and second external electrodes 131 and 132, respectively, and the first and second external electrodes 131 and 132 may be disposed at the opposite end portions of the capacitor body 110 in the X direction, respectively, and may be electrically connected to the exposed end portions of the first and second internal electrodes 121 and 122, respectively.

The first external electrode 131 may include a first head portion 131a and a first band portion 131b.

The first head portion 131a may be disposed on the third surface 3 of the capacitor body 110, and may be in contact with the end portions of the first internal electrodes 121 externally exposed through the third surface 3 of the capacitor body 110 to serve to electrically connect the first internal electrodes 121 and the first external electrode 131 to each other.

The first band portion 131b may extend from the first head portion 131a to a portion of the first surface 1 of the capacitor body 110, and may serve to be electrically connected to a first external terminal 220 of the interposer 200.

Here, the first band portion 131b may further extend from the first head portion 131a to portions of the second, fifth, and sixth surfaces 2, 5, and 6 of the capacitor body 110 in order to improve adhesion strength, or the like.

The second external electrode 132 may include a second head portion 132a and a second band portion 132b.

The second head portion 132a may be disposed on the fourth surface 4 of the capacitor body 110, and may be in contact with the end portions of the second internal electrodes 122 externally exposed through the fourth surface 4 of the capacitor body 110 to serve to electrically connect the second internal electrodes 122 and the second external electrode 132 to each other.

The second band portion 132b may extend from the second head portion 132a to a portion of the first surface 1 of the capacitor body 110, and may serve to be electrically connected to a second external terminal 230 of the interposer 200.

Here, the second band portion 132b may further extend from the second head portion 132a to portions of the second, fifth, and sixth surfaces 2, 5, and 6 of the capacitor body 110 in order to improve adhesion strength, or the like.

Meanwhile, the first and second external electrodes 131 and 132 may further include plating layers.

The plating layers may include first and second nickel (Ni) plating layers and first and second tin (Sn) plating layers respectively covering the first and second nickel plating layers.

The interposer 200 according to the present exemplary embodiment may include an interposer body 210 and the first and second external terminals 220 and 230 at opposite end portions of the interposer body 210 in the X direction, respectively.

In this case, a length of the interposer 200 in the X direction and a width of the interposer 200 in the Y direction may be smaller than a length in the X direction and a width in the Y direction of the multilayer ceramic capacitor, respectively. The length of the interposer 200 in the X direction may refer to the longest distance between two portions of the interposer 200 in the X direction.

The interposer body 210 may be formed of an insulator.

In this case, grooves may be formed in opposite surfaces of the interposer body 210 in the X direction, respectively. As such, central portions of the opposite surfaces of the interposer body 210 in the X direction may be recessed toward each other, with respect to edge portions of the opposite surfaces of the interposer body 210 in the X direction.

Voltages having different polarities may be provided to the first and second external terminals 220 and 230, and the first and second external terminals 220 and 230 may be electrically and mechanically connected to the first and second band portions 131b and 132b of the first and second external electrodes 131 and 132, respectively.

The first external terminal 220 may include a first bonding portion 222, a first mounting portion 221, and a first connection portion 223.

The first bonding portion 222, disposed on an upper surface of the interposer body 210, may have one end exposed through one surface of the interposer body 210 in the X direction and be connected to the first band portion 131b of the first external electrode 131.

The first mounting portion 221, disposed on a lower surface of the interposer body 210 to face the first bonding portion 221 in the Z direction, may serve as a terminal at the time of mounting the electronic component 101 on a board.

The first connection portion 223 may be disposed on the groove formed in one end surface of the interposer body 210 in the X direction, and may serve to connect an end portion of the first bonding portion 222 and an end portion of the first mounting portion 221 to each other.

In this case, a first conductive adhesive portion 321 (shown in FIG. 4 to be described later) may be disposed between the first bonding portion 222 and the first band portion 131b to bond the first bonding portion 222 and the first band portion 131b to each other.

The first conductive adhesive portion 321 may be formed of a high melting point solder, or the like.

The second external terminal 230 may include a second bonding portion 232, a second mounting portion 231, and a second connection portion 233.

The second bonding portion 232, disposed on the upper surface of the interposer body 210, may have one end exposed through the other surface of the interposer body 210 in the X direction and be connected to the second band portion 132b of the second external electrode 132.

The second mounting portion 231, disposed on the lower surface of the interposer body 210 to face the second bonding portion 231 in the Z direction, may serve as a terminal at the time of mounting the electronic component 101 on the board.

The second connection portion 233 may be disposed on the groove formed in the other end surface of the interposer body 210 in the X direction, and may serve to connect an end portion of the second bonding portion 232 and an end portion of the second mounting portion 231 to each other.

In this case, a second conductive adhesive portion 322 (shown in FIG. 4 to be described later) may be disposed between the second bonding portion 232 and the second band portion 132b to bond the second bonding portion 232 and the second mounting portion 231 to each other.

The second conductive adhesive portion 322 may be formed of a high melting point solder, or the like.

In addition, plating layers may be formed on surfaces of the first and second external terminals 220 and 230, if necessary.

The plating layers may include nickel plating layers and tin plating layers covering the nickel plating layers.

When voltages having different polarities are applied to the first and second external electrodes 131 and 132 formed in the electronic component 101 in a state in which the electronic component 101 is mounted on the board through solders, the capacitor body 110 may be expanded and contracted in the Z direction due to an inverse piezoelectric effect of the dielectric layers 111.

Therefore, both end portions of the first and second external electrodes 131 and 132 may be contracted and expanded as opposed to the expansion and the contraction of the capacitor body 110 in the Z direction due to a Poisson effect, and such a contraction and expansion may generate vibrations.

In addition, the vibrations may be transferred to the board through the first and second external electrodes 131 and 132 and the first and second external terminals 220 and 230. Therefore, a sound may be radiated from the board to become an acoustic noise.

The interposer 200 according to the present exemplary embodiment may be attached to the first surface 1 of the multilayer ceramic capacitor 100, a mounting direction of the multilayer ceramic capacitor 100, to serve to prevent the vibrations of the multilayer ceramic capacitor 100 from being transferred to the board, resulting in a reduction in the acoustic noise of the multilayer ceramic capacitor 100.

Experimental Example 1

In general, a size of a multilayer ceramic capacitor for which an interposer is used in order to reduce a vibration sound is 1005 to 1608.

However, in accordance with the trend toward performance improvement and miniaturization of an electronic device, the necessity for a multilayer ceramic capacitor having a small size has increased. Therefore, the necessity to effectively reduce a vibration sound even in a multilayer ceramic capacitor having a small size of 0804 or less has increased.

Meanwhile, as a size of the multilayer ceramic capacitor is reduced, it becomes important to manage bonding precision at the time of bonding the multilayer ceramic capacitor and the interposer to each other.

The reason is that when the bonding precision is beyond a predetermined level, a balance of the multilayer ceramic capacitor is lost, such that a vibration sound is rapidly increased.

The present experiment is performed in order to confirm a limitation of a bonding misalignment between the multilayer ceramic capacitor and the interposer at which a vibration sound is not rapidly increased at the time of bonding the multilayer ceramic capacitor having the small size of 0804 to the interposer.

The multilayer ceramic capacitor used in the present experiment has a length of 0.6 mm in the X direction, a width of 0.3 mm in the Y direction, and electrical characteristics of 2.2 µF.

In addition, the interposer has a length of 0.6 mm in the X direction, a width of 0.34 mm in the Y direction, and a thickness of 0.06 mm in the Z direction.

The interposers were bonded to lower surfaces of the multilayer ceramic capacitors using solders to manufacture electronic component samples, misalignments between the multilayer ceramic capacitor and the interposer in the X direction and the Y direction were measured and classified in each of the electronic component samples, and the respective acoustic noises were then measured.

TABLE 1

| | Length (X) Direction | | |
|---|---|---|---|
| # | $\Delta L$ [mm] | $\Delta L/L$ | Acoustic Noise [dB] |
| 1 | 0.00 | 0.000 | 21.9 |
| 2 | 0.00 | 0.000 | 21.8 |
| 3 | 0.00 | 0.000 | 22.1 |
| 4 | 0.01 | 0.017 | 22.3 |
| 5 | 0.01 | 0.017 | 21.7 |
| 6 | 0.02 | 0.033 | 21.8 |
| 7 | 0.02 | 0.033 | 22.0 |
| 8 | 0.03 | 0.050 | 21.9 |
| 9 | 0.04 | 0.067 | 22.4 |
| 10 | 0.05 | 0.083 | 23.1 |
| 11 | 0.06 | 0.100 | 23.3 |
| 12 | 0.07 | 0.117 | 25.9 |
| 13 | 0.07 | 0.117 | 26.2 |
| 14 | 0.08 | 0.133 | 28.8 |
| 15 | 0.09 | 0.150 | 27.8 |
| 16 | 0.11 | 0.183 | 30.3 |
| 17 | 0.12 | 0.200 | 32.4 |
| 18 | 0.15 | 0.250 | 32.7 |
| 19 | 0.16 | 0.267 | 38.9 |
| 20 | 0.16 | 0.267 | 38.7 |

Figure 4:
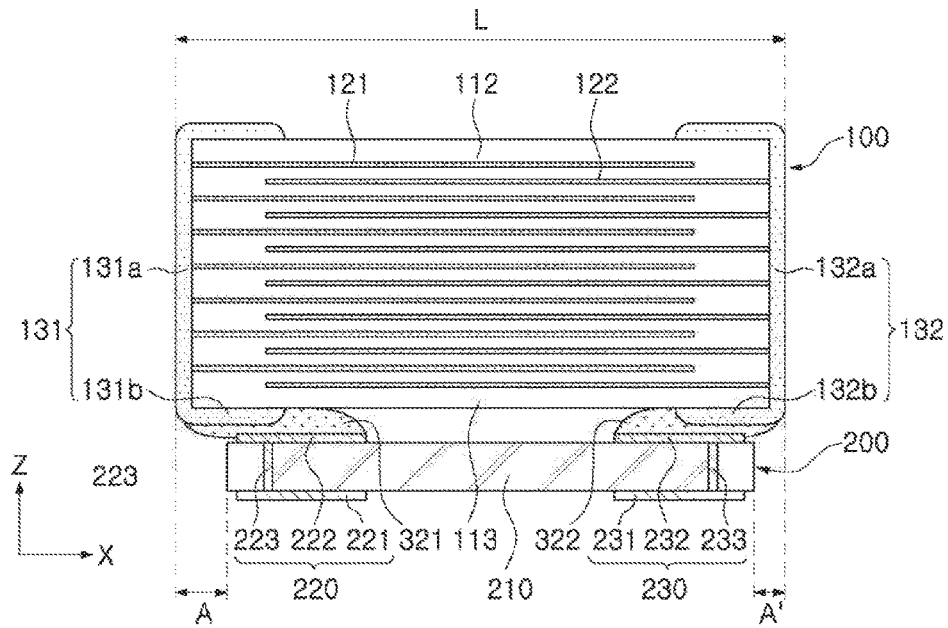
FIG. 4 is a cross-sectional view taken along line I-I' of FIG. 1.

Referring to FIG. 4, A is a distance from one end portion of the interposer 200 in the X direction, the length direction, to one end portion of the multilayer ceramic capacitor 100 in the X direction, and A' is a distance from the other end portion of the interposer 200 in the X direction to the other end portion of the multilayer ceramic capacitor 100 in the X direction. $\Delta L$ ($\Delta L=|A-A'|/2$) is an offset between the multilayer ceramic capacitor and the interposer in the X direction.

Figure 5:
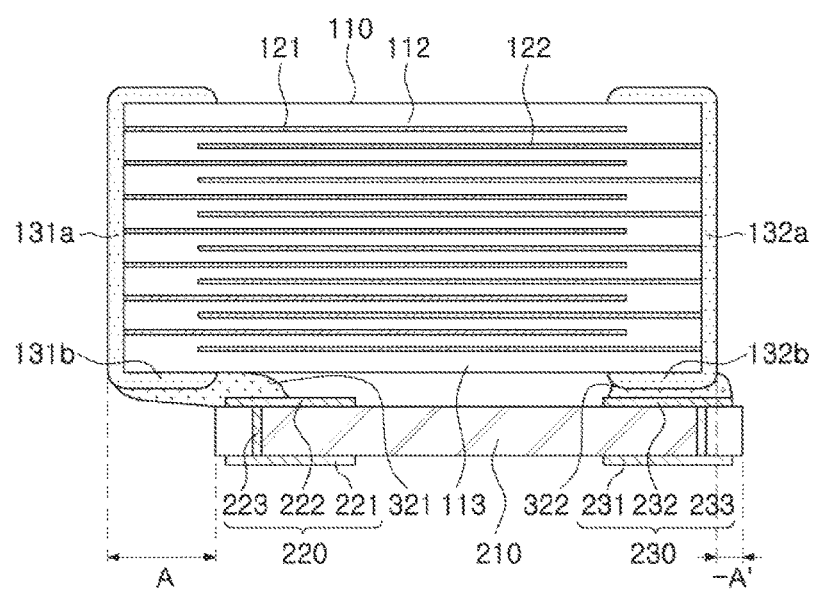
FIG. 5 is a cross-sectional view illustrating a case in which an interposer is partially deviated outwardly of the multilayer ceramic capacitor in FIG. 4.

In this case, as illustrated in FIG. 5, when the interposer 200 is partially deviated outwardly of the multilayer ceramic capacitor 100, one of A' and A may have a negative value and the other of A' and A may have a positive value. In addition, L of FIG. 4 refers to a length of the multilayer ceramic capacitor 100 in the X direction.

Meanwhile, in some samples, an offset between the multilayer ceramic capacitor and the interposer in the Y direction, the width direction, is generated, but a value of the offset is very small (0.01 mm or less). Therefore, it is considered in the present experiment that the offset between the multilayer ceramic capacitor and the interposer in the Y direction does not have a direct influence on an acoustic noise.

Referring to Table 1 and FIG. 9, it may be seen that an influence of the offset between the multilayer ceramic capacitor and the interposer in the X direction on the acoustic noise is greater than that of an offset between the multilayer ceramic capacitor and the interposer in the Y direction to be described below on the acoustic noise.

In addition, it may be confirmed that in Samples 1 to 11 in which $\Delta L/L$ is 0.100 or less, acoustic noise, of 21.8 dB to 23.3 dB, is not significantly changed, but in Sample in which $\Delta L/L$ exceeds 0.100, an acoustic noise is significantly increased to 25.9 dB, and in Samples 13 to 20, whenever $\Delta L/L$ is increased, an acoustic noise is also significantly increased and is increased up to 38.9 dB.

Therefore, a limitation of the bonding misalignment between the multilayer ceramic capacitor and the interposer in the X direction at which an acoustic noise reducing effect may be expected may be that $\Delta L/L$ is 0.100 or less.

TABLE 2

| | Width (Y) Direction | | |
|---|---|---|---|
| # | $\Delta W$ [mm] | $\Delta W/W$ | Acoustic Noise [dB] |
| 21 | 0.00 | 0.000 | 21.9 |
| 22 | 0.00 | 0.000 | 21.8 |
| 23 | 0.01 | 0.033 | 21.8 |
| 24 | 0.02 | 0.067 | 22.1 |
| 25 | 0.02 | 0.067 | 22.0 |
| 26 | 0.02 | 0.067 | 21.9 |
| 27 | 0.03 | 0.100 | 22.2 |
| 28 | 0.03 | 0.100 | 22.0 |
| 29 | 0.04 | 0.133 | 22.4 |
| 30 | 0.05 | 0.167 | 22.3 |
| 31 | 0.05 | 0.167 | 22.5 |
| 32 | 0.06 | 0.200 | 24.8 |
| 33 | 0.06 | 0.200 | 25.1 |
| 34 | 0.06 | 0.200 | 24.9 |
| 35 | 0.07 | 0.233 | 26.6 |
| 36 | 0.08 | 0.267 | 27.4 |
| 37 | 0.09 | 0.300 | 28.0 |
| 38 | 0.10 | 0.333 | 29.4 |
| 39 | 0.12 | 0.400 | 30.0 |
| 40 | 0.13 | 0.433 | 31.6 |

Figure 6:
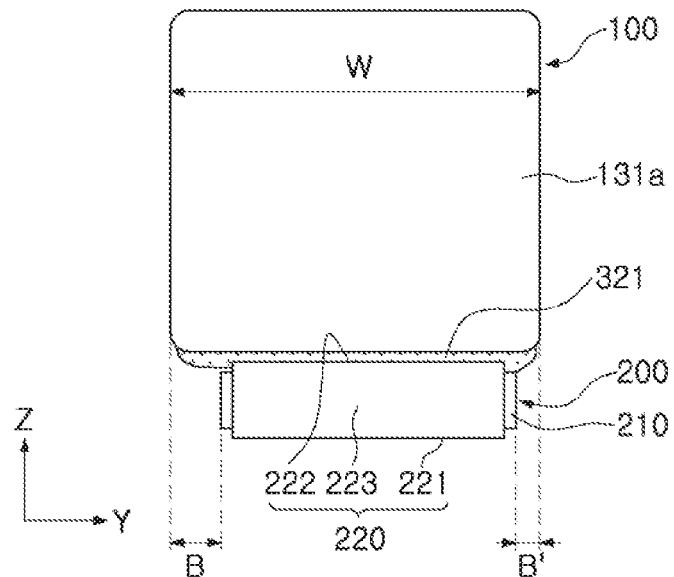
FIG. 6 is a side view of FIG. 1.

Referring to FIG. 6, B is a distance from one end portion of the interposer 200 in the Y direction, the width direction, to one end portion of the multilayer ceramic capacitor 100 in the Y direction, and B' is a distance from the other end portion of the interposer 200 in the Y direction to the other end portion of the multilayer ceramic capacitor 100 in the Y direction. $\Delta W$ ($\Delta W=|B-B'|/2$) is an offset between the multilayer ceramic capacitor and the interposer in the Y direction.

Figure 7:
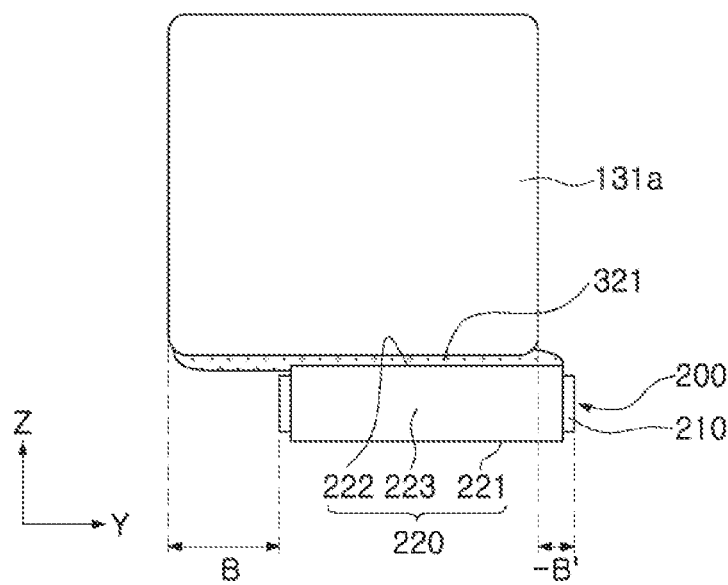
FIG. 7 is a side view illustrating a case in which an interposer is partially deviated outwardly of the multilayer ceramic capacitor in FIG. 6.

In this case, as illustrated in FIG. 7, when the interposer 200 is partially deviated outwardly of the multilayer ceramic capacitor 100, one of B' and B may have a negative value and the other of B' and B may have a positive value. In addition, W of FIG. 6 refers to a width of the multilayer ceramic capacitor 100 in the Y direction.

Meanwhile, in some samples, an offset between the multilayer ceramic capacitor and the interposer in the X direction, the length direction, is generated, but a value of the offset is very small (0.01 mm or less). Therefore, it is considered in the present experiment that the offset between the multilayer ceramic capacitor and the interposer in the X direction does not have a direct influence on an acoustic noise.

Figure 9:
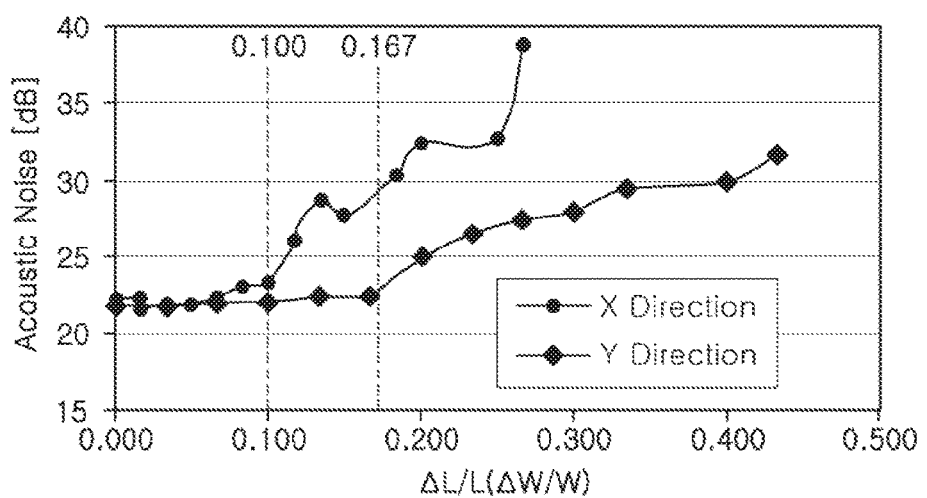
FIG. 9 is graphs illustrating acoustic noises depending on misalignments between the multilayer ceramic capacitor and the interposer in an X direction and a Y direction.

Referring to Table 2 and FIG. 9, it may be confirmed that in Samples 21 to 31 in which $\Delta W/W$ is 0.167 or less, an acoustic noise, 21.8 dB to 22.5 dB, is not significantly changed, but in Sample 32 in which $\Delta W/W$ exceeds 0.167, an acoustic noise is significantly increased to 24.8 dB, and in Samples 33 to 40, whenever ΔW/W is increased, an acoustic noise is also significantly increased and is increased up to 31.6 dB.

Therefore, a limitation of the bonding misalignment between the multilayer ceramic capacitor and the interposer in the Y direction at which an acoustic noise reducing effect may be expected may be that ΔW/W is 0.167 or less.

Experimental Example 2

The bonding misalignment between the multilayer ceramic capacitor and the interposer may be solved to some degree by a self-alignment phenomenon using surface energy of solders in a reflow process of the solders.

The self-alignment phenomenon occurs in a predetermined range of a distance between the shortest length of the interposer in the X direction and a central point of the external electrode of the multilayer ceramic capacitor, and a balance between weights of the multilayer ceramic capacitor and the interposer is lost outside of the predetermined range, such that the bonding misalignment between the multilayer ceramic capacitor and the interposer is increased. The present experiment is performed in order to demonstrate such a range.

The multilayer ceramic capacitor 100 used in the present experiment has a length of 0.6 mm in the X direction, a width of 0.3 mm in the Y direction, and electrical characteristics of 2.2 μF.

In addition, the interposer 200 has a length of 0.6 mm in the X direction, a width of 0.34 mm in the Y direction, and a thickness of 0.06 mm in the Z direction.

Figure 8:
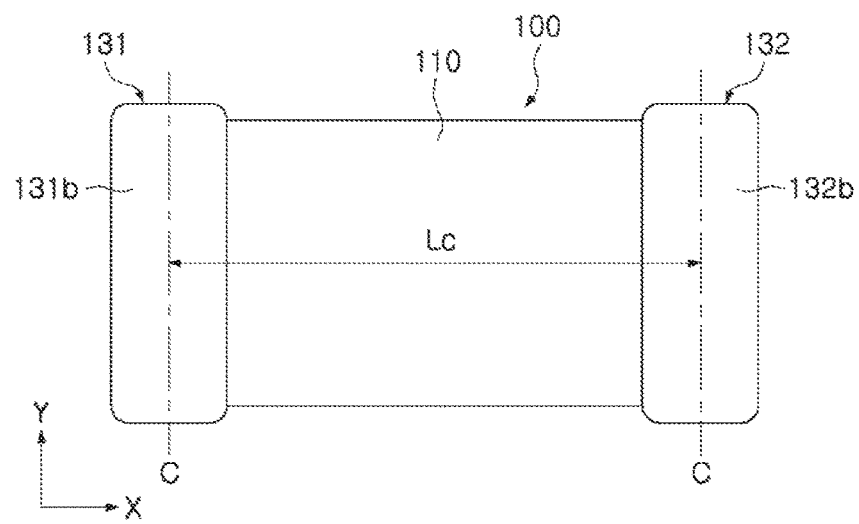
FIG. 8 is a plan view of FIG. 1.

In addition, in FIG. 8, a length of a line connecting central portions C of the first and second band portions 131b and 132n of the first and second external electrodes 131 and 132 to each other in the X direction in the multilayer ceramic capacitor 100 is defined as Lc, and in FIG. 2, the shortest distance between the first and second connection portions 223 and 233 disposed on two grooves formed in the opposite surfaces of the interposer body 210 in the X direction, respectively, is defined as Li.

In this case, the multilayer ceramic capacitor 100 is manufactured so that Lc is fixed to 0.58 mm, and the interposer 200 is manufactured so that Li is variously changed in a range of 0.52 mm to 0.62 mm.

In the present experiment, the multilayer ceramic capacitor 100 and the interposer 200 prepared as described above are bonded to each other, but are bonded to each other so that coordinates of pieces of equipment are arbitrarily misaligned with each other by about 60 μm, a reflow process is performed, and an offset between the multilayer ceramic capacitor 100 and the interposer 200 in the X direction is then measured. Here, a case in which the offset between the multilayer ceramic capacitor 100 and the interposer 200 in the X direction is 60 μm or more is classified into NG.

TABLE 3

| # | Lc [mm] | Li [mm] | Misalignment between Multilayer Ceramic Capacitor and Interposer in X Direction (NG) [%] |
|---|---------|---------|------------------------------------------------------------------------------------------|
| 1 | 0.58    | 0.62    | 0                                                                                        |
| 2 |         | 0.6     | 0                                                                                        |
| 3 |         | 0.58    | 4                                                                                        |
| 4 |         | 0.56    | 36                                                                                       |
| 5 |         | 0.54    | 64                                                                                       |
| 6 |         | 0.52    | 86                                                                                       |

Referring to Table 3, in Samples 1 and 2 in which Lc<Li, a bonding misalignment between the multilayer ceramic capacitor and the interposer was less than 60 μm, such that a bonding misalignment defect between the multilayer ceramic capacitor and the interposer in the X direction did not occur.

In addition, in Sample 3 in which Lc=Li, a bonding misalignment defect between the multilayer ceramic capacitor and the interposer in the X direction of 4% occurred.

In addition, in Samples 4 to 6 in which Lc>Li, a bonding misalignment between the multilayer ceramic capacitor and the interposer was 60 μm or more, such that a large bonding misalignment defect between the multilayer ceramic capacitor and the interposer in the X direction of 36% or more occurred.

Therefore, it may be confirmed a relationship between Lc and Li capable of solving the bonding misalignment defect between the multilayer ceramic capacitor and the interposer in the X direction by self-alignment by preventing the balance between the weights of the multilayer ceramic capacitor and the interposer from being lost is Lc≤Li.

As set forth above, according to an exemplary embodiment in the present disclosure, an acoustic noise reducing effect of a predetermined level or more may be expected even in a multilayer ceramic capacitor having a small size.

While exemplary embodiments have been shown and described above, it will be apparent to those skilled in the art that modifications and variations could be made without departing from the scope of the present invention as defined by the appended claims.

What is claimed is:

1. An electronic component comprising:
    a multilayer ceramic capacitor including a capacitor body and a pair of external electrodes disposed on opposite ends of the capacitor body, respectively; and
    an interposer including an interposer body having grooves in opposite surfaces thereof, respectively, and a pair of external terminals disposed at opposite ends of the interposer body, respectively,
    wherein each of the external terminals includes a bonding portion disposed on an upper surface of the interposer body and connected to a respective one of the external electrodes, a mounting portion disposed on a lower surface of the interposer body, and a connection portion disposed on a respective one of the grooves of the interposer body to connect the bonding portion and the mounting portion to each other, and
    ΔL/L≤0.100 in which L is a length of the multilayer ceramic capacitor and ΔL=|A−A'|/2, where A is a distance from one end portion of the interposer in a length direction to one end portion of the multilayer ceramic capacitor in the length direction, and A' is a distance from the other end portion of the interposer in the length direction to the other end portion of the multilayer ceramic capacitor in the length direction.

2. The electronic component of claim 1, wherein the multilayer ceramic capacitor has a length of 0.8 mm or less and a width of 0.4 mm or less.

3. The electronic component of claim 1, wherein the multilayer ceramic capacitor has a thickness of 0.7 mm or less.

4. The electronic component of claim 1, further comprising conductive adhesive portions disposed between the external electrodes and the external terminals, respectively.

5. The electronic component of claim 1, wherein the interposer body is formed of an insulator.

6. The electronic component of claim 1, wherein the capacitor body has first and second surfaces opposing each other, third and fourth surfaces connected to the first and second surfaces and opposing each other, and fifth and sixth surfaces connected to the first and second surfaces, connected to the third and fourth surfaces, and opposing each other, and includes a plurality of dielectric layers and a plurality of first and second internal electrodes alternately arranged in a direction connecting the first and second surfaces to each other with each of the dielectric layers interposed therebetween, and ends of the first and second internal electrodes are exposed through the third and fourth surfaces, respectively, to be connected to the pair of external electrodes, respectively.

7. The electronic component of claim 6, wherein the external electrodes include:

head portions disposed on the third and fourth surfaces of the capacitor body, respectively, and connected to the ends of the first and second internal electrodes, respectively; and band portions extending from the head portions onto portions of the first surface of the capacitor body and connected to the bonding portions of the external terminals, respectively.

8. The electronic component of claim 7, wherein $Lc \leq Li$ in which Lc is a distance in the length direction between centers of the band portions of the external electrodes, and Li is a shortest distance in the length direction between the connection portions disposed on the grooves in the opposite surfaces of the interposer body.

9. The electronic component of claim 1, further comprising plating layers disposed on surfaces of the external electrode and the external terminal, respectively.

10. The electronic component of claim 1, wherein the interposer having a length and a width smaller than a length and a width of the multilayer ceramic capacitor, respectively.

11. The electronic component of claim 1, wherein the interposer having a width greater than a width of the multilayer ceramic capacitor.

12. An electronic component comprising:

a multilayer ceramic capacitor including a capacitor body and a pair of external electrodes disposed on opposite ends of the capacitor body, respectively; and an interposer including an interposer body having grooves in opposite surfaces thereof, respectively, and a pair of external terminals disposed at opposite ends of the interposer body, respectively, wherein each of the external terminals includes a bonding portion disposed on an upper surface of the interposer body and connected to a respective one of the external electrodes, a mounting portion disposed on a lower surface of the interposer body, and a connection portion disposed on a respective one of the grooves of the interposer body to connect the bonding portion and the mounting portion to each other, and $\Delta W/W \leq 0.167$ in which W is a width of the multilayer ceramic capacitor and $\Delta W = |B-B'|/2$, where B is a distance from one end portion of the interposer in a width direction to one end portion of the multilayer ceramic capacitor in the width direction, and B' is a distance from the other end portion of the interposer in the width direction to the other end portion of the multilayer ceramic capacitor in the width direction.

13. The electronic component of claim 12, wherein the multilayer ceramic capacitor has a length of 0.8 mm or less and a width of 0.4 mm or less.

14. The electronic component of claim 12, wherein the multilayer ceramic capacitor has a thickness of 0.7 mm or less.

15. The electronic component of claim 12, further comprising conductive adhesive portions disposed between the external electrodes and the external terminals, respectively.

16. The electronic component of claim 12, wherein the capacitor body has first and second surfaces opposing each other, third and fourth surfaces connected to the first and second surfaces and opposing each other, and fifth and sixth surfaces connected to the first and second surfaces, connected to the third and fourth surfaces, and opposing each other, and includes a plurality of dielectric layers and a plurality of first and second internal electrodes alternately arranged in a direction connecting the first and second surfaces to each other with each of the dielectric layers interposed therebetween, and ends of the first and second internal electrodes are exposed through the third and fourth surfaces, respectively, to be connected to the pair of external electrodes, respectively.

17. The electronic component of claim 16, wherein the external electrodes include:

head portions disposed on the third and fourth surfaces of the capacitor body, respectively, and connected to the ends of the first and second internal electrodes, respectively; and band portions extending from the head portions onto portions of the first surface of the capacitor body and connected to the bonding portions of the external terminals, respectively.

18. The electronic component of claim 17, wherein $Lc \leq Li$ in which Lc is a distance in the length direction between centers of the band portions of the external electrodes, and Li is a shortest distance in the length direction between the connection portions disposed on the grooves in the opposite surfaces of the interposer body.

19. The electronic component of claim 12, wherein the interposer having a length and a width smaller than a length and a width of the multilayer ceramic capacitor, respectively.

20. The electronic component of claim 12, wherein the interposer having a width greater than a width of the multilayer ceramic capacitor.

* * * * *